United States Patent
Whang et al.

(10) Patent No.: US 6,541,328 B2
(45) Date of Patent: Apr. 1, 2003

(54) METHOD OF FABRICATING METAL OXIDE SEMICONDUCTOR TRANSISTOR WITH LIGHTLY DOPED IMPURITY REGIONS FORMED AFTER REMOVING SPACERS USED FOR DEFINING HIGHER DENSITY IMPURITY REGIONS

(75) Inventors: Sung-man Whang, Suwon (KR); Hyung-moo Park, Seoul (KR); Dong-cho Maeng, Yongin (KR); Hyae-Ryoung Lee, Suwon (KR); Ho-woo Park, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/000,894

(22) Filed: Nov. 2, 2001

(65) Prior Publication Data

US 2002/0115258 A1 Aug. 22, 2002

(30) Foreign Application Priority Data

Feb. 19, 2001  (KR) .......................... 2001-8139

(51) Int. Cl.⁷ .......................... H01L 21/8238
(52) U.S. Cl. .................. 438/231; 438/305; 438/514
(58) Field of Search ................ 438/229, 230, 438/231, 232, 301, 303, 305, 306, 514, 527

(56) References Cited

U.S. PATENT DOCUMENTS

| | | | | |
|---|---|---|---|---|
| 4,978,626 A | * | 12/1990 | Poon et al. ............... 437/44 |
| 5,015,595 A | * | 5/1991 | Wollesen ................ 437/31 |
| 5,024,959 A | * | 6/1991 | Pfiester .................. 437/34 |
| 5,610,088 A | * | 3/1997 | Chang et al. ............. 437/34 |
| 5,757,045 A | * | 5/1998 | Tsai et al. ............. 257/336 |
| 5,844,276 A | * | 12/1998 | Fulford et al. ......... 257/336 |
| 6,013,569 A | * | 1/2000 | Lur et al. .............. 438/595 |
| 6,083,846 A | * | 7/2000 | Fulford et al. ......... 438/740 |
| 6,153,455 A | * | 11/2000 | Ling et al. ............. 438/231 |
| 6,245,626 B1 | * | 6/2001 | Chen et al. ............ 438/305 |
| 6,248,633 B1 | * | 6/2001 | Ogura et al. ........... 438/267 |
| 6,300,207 B1 | * | 10/2001 | Ju ....................... 438/305 |
| 2001/0041398 A1 | * | 11/2001 | Angello et al. ......... 438/197 |
| 2002/0001910 A1 | * | 1/2002 | Chen et al. ............ 438/305 |

* cited by examiner

*Primary Examiner*—Carl Whitehead, Jr.
*Assistant Examiner*—Stephen W. Smoot
(74) *Attorney, Agent, or Firm*—Mills & Onello, LLP

(57) ABSTRACT

In a method of fabricating a metal oxide semiconductor (MOS) transistor with a lightly doped drain (LDD) structure without spacers, gate electrodes and spacers are formed on a semiconductor substrate. A high density source/drain region is formed using the gate electrodes and the spacers as masks. A low density source/drain region is formed after removing the spacers. It is possible to reduce the thermal stress of the low density source/drain region by forming the high density source/drain region before the low density source/drain region is formed and to increase an area, in which suicide is formed, by forming a structure without spacers. Also, it is possible to simplify processes of fabricating a complementary metal oxide semiconductor (CMOS) LDD transistor by reducing the number of photoresist pattern forming processes in the method.

25 Claims, 3 Drawing Sheets

METHOD OF FABRICATING METAL OXIDE SEMICONDUCTOR TRANSISTOR WITH LIGHTLY DOPED IMPURITY REGIONS FORMED AFTER REMOVING SPACERS USED FOR DEFINING HIGHER DENSITY IMPURITY REGIONS

BACKGROUND OF THE INVENTION

1. Field of the Invention

The present invention relates to a method of fabricating a semiconductor device, and more particularly, to a method of fabricating a metal oxide semiconductor (MOS) transistor having a lightly doped drain (LDD) structure without a gate spacer.

2. Description of the Related Art

As semiconductor devices have rapidly decreased in size, many changes to the structure of transistors have been required. For example, a short channeled device is required in order to increase the operation speed and in order to produce highly integrated semiconductor devices. As the channel length of the transistors becomes shorter, a problem referred to as the "punch through" phenomenon occurs. In order to address this issue, a shallow junction, which is capable of reducing the strength of an electric field between a source region and a drain region during the operation of a transistor, is realized.

Processes of forming a lightly doped drain (LDD) structure, which have been used in forming such a shallow junction, will now be described. First, a gate electrode is formed on a semiconductor substrate. Low density impurity ions are implanted into a source/drain region using a gate electrode as a mask, and then annealing is performed. Spacers are formed on both side walls of the gate electrode. High density impurity ions are implanted into the source/drain region using the gate electrode and the spacers as masks, and then annealing is performed.

In the above-mentioned conventional method of fabricating the transistor with the LDD structure, a low density source/drain region is formed before forming a high density source/drain region. Therefore, thermal stress of the low density source/drain region increases and diffusion of impurities may occur since the low density source/drain region undergoes an annealing process twice. Also, in forming a metal silicide film in an active region or in the gate electrode, the distance between gate spacers becomes narrower as the pattern of a transistor becomes smaller. Therefore, it is not easy to form the metal silicide film.

Processes of forming the LDD structure of a complementary metal oxide semiconductor (CMOS) obtained by combining a p-type MOS (PMOS) with an n-type MOS (NMOS) will now be described. The conductivity type of the channel in the PMOS is different from the conductivity type of the channel in the NMOS. A semiconductor substrate, in which the PMOS is to be formed, is covered with a photoresist pattern. Low density n-type impurity ions are implanted into a substrate in region where the NMOS is to be formed. Then, after removing the photoresist pattern, the semiconductor substrate, in which the NMOS is formed, is covered with another photoresist pattern. Low density p-type impurity ions are implanted into the substrate in a region where the PMOS is to be formed. After removing the photoresist pattern, spacers are formed on the side walls of the gate electrodes of the PMOS and the NMOS. The semiconductor substrate, in which the PMOS is formed, is covered with the photoresist pattern. High density n-type impurity ions are implanted into the substrate where the NMOS is formed. Then, after removing the photoresist pattern, the semiconductor substrate, in which the NMOS is formed, is covered with still another photoresist pattern. High density p-type impurity ions are implanted into the substrate where the PMOS is formed.

It is a complicated, and therefore expensive, procedure to perform a photoresist pattern process four times in order to form transistors having channels of different conductivity type on the semiconductor substrate.

SUMMARY OF THE INVENTION

To address the above limitations, it is a first object of the present invention to provide a method of fabricating a metal oxide semiconductor (MOS) transistor with a lightly doped drain (LDD) structure in which the thermal stress of a low density source/drain region is minimized and in which a metal suicide film can be easily formed.

It is a second object of the present invention to provide a method of fabricating a MOS transistor with a complementary metal oxide semiconductor (CMOS) LDD structure in which the processes of the method are simplified.

Accordingly, to achieve the first object, there is provided a method of fabricating a metal oxide semiconductor (MOS) transistor. Gate electrodes are formed on a semiconductor substrate. Spacers are formed on both side walls of the gate electrodes. First impurity regions having a first density are formed on both sides of the spacers in the semiconductor substrate. The spacers are removed. Second impurity regions having a second density that is lower than the first density are formed on both sides of the gate electrodes in the semiconductor substrate.

It is preferable that between the formation of the gate electrodes and the formation of the spacers, insulating films are formed at both edges formed by the semiconductor substrate and the gate electrodes such that undercuts are formed between the gate electrodes and the spacers and between the spacers and the semiconductor substrate. In the step of forming the insulating films, an insulating material layer is formed on the entire surface of the semiconductor substrate, on which the gate electrodes are formed; spacers having a different etching selectivity from the etching selectivity of the insulating material layer are formed on the side walls of the gate electrodes, on which the insulating material layer is formed; and the insulating material layer is etched such that undercuts are formed between the gate electrodes and the spacers and between the semiconductor substrate and the spacers.

The insulating films are preferably formed to have "L" shaped cross-sections. The insulating films are formed of $Si_3N_4$. A metal silicide film is formed on the semiconductor substrate where the first impurity regions are formed, on the gate electrodes, and on the upper side walls of the gate electrodes, on which the insulating films are not formed. In the step of forming the first impurity regions, first impurities are ion implanted into the semiconductor substrate using the gate electrode and the spacers as masks. The spacers are formed of polysilicon. The spacers are removed using, for example, $NH_4OH$.

To achieve the second object, there is provided a method of fabricating a MOS transistor. A first region and a second region are formed on a semiconductor substrate. A first gate electrode and a second gate electrode are formed on the first region and the second region of the semiconductor substrate, respectively. Spacers are formed on both side walls of the first gate electrode and the second gate electrode. The entire surface of the semiconductor substrate in the second region covered with a first mask. First impurity regions doped with a first conductivity type material having a first density are formed in the semiconductor substrate in the first region. The spacers of the first region are removed. Second impurity regions doped with the first conductivity type material having a second density that is lower than the first density are formed in the semiconductor substrate on both sides of the first gate electrode exposed by removing the spacers of the first region. After removing the first mask, the entire surface of the semiconductor substrate of the first region is covered with a second mask. Third impurity regions doped with a second conductivity type material having a third density are formed in the semiconductor substrate in the second region using the spacers and the second gate electrode formed in the second region as masks. The spacers of the second region are removed. Fourth impurity regions doped with the second conductivity type material having a fourth density that is lower than the third density are formed in the semiconductor substrate on both sides of the second gate electrode exposed by removing the spacers of the second region.

Preferably, between the formation of the first and second gate electrodes and the formation of the spacers, insulating films are formed at both edges formed by the semiconductor substrate and the first and second gate electrodes so that undercuts are formed between the first and second gate electrodes and the spacers and between the spacers and the semiconductor substrate. A metal silicide film is formed on the semiconductor substrate where the first impurity regions are formed, on the semiconductor substrate where the third impurities are formed, on the first and second gate electrodes, and on the upper side walls, on which the insulating films are not formed, after the step of removing the second mask. In the step of forming the insulating films, an insulating material layer is formed on the entire surface of the semiconductor substrate, on which the first and second gate electrodes are formed; spacers are formed on the side walls of the first and second gate electrodes, on which the insulating material layer is formed; and the insulating material layer is etched so that the undercuts are formed between the first and second gate electrodes and between the semiconductor substrate and the spacers.

Preferably, the insulating films are formed to have "L" shaped cross-sections. The insulating films are formed of $Si_3N_4$. In the step of forming the first impurity regions, the first conductive material is ion implanted into the semiconductor substrate of the first region using the first gate electrode and the spacers, which are formed in the first region, as masks. In the step of forming the third impurity regions, the second conductive material is ion implanted into the semiconductor substrate of the second region using the second gate electrode and the spacers, which are formed in the second region as masks. The spacers are formed of polysilicon. The spacers can be removed by wet etching using, for example, $NH_4OH$.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF PREFERRED EMBODIMENTS

Figure 1:
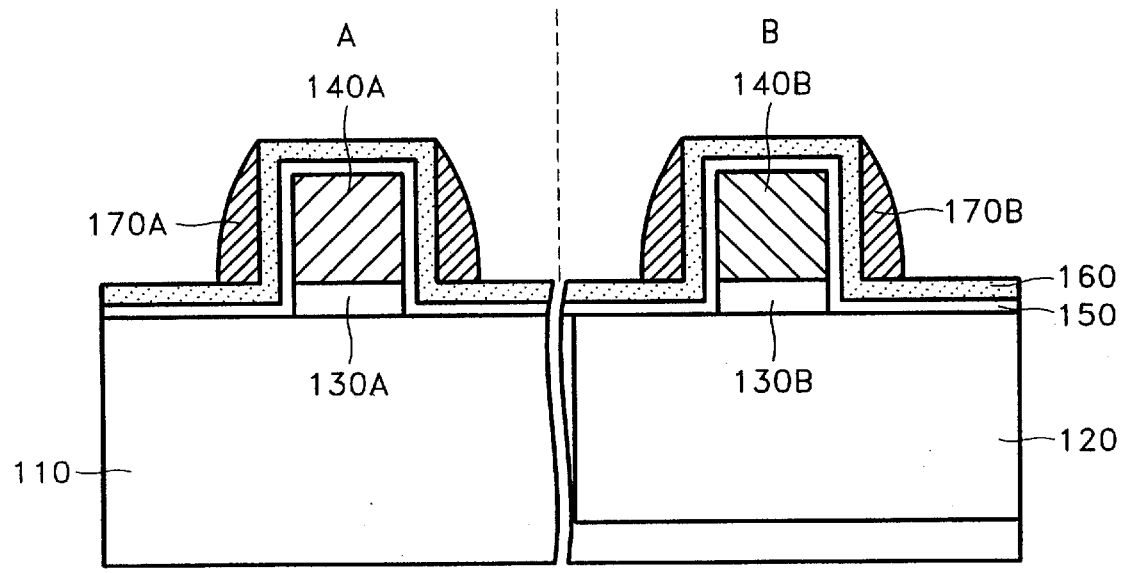
FIGS. 1 through 6 are sectional views illustrating a method of fabricating a metal oxide semiconductor (MOS) transistor according to the present invention.

The present invention now will be described more fully with reference to the accompanying drawings, in which a preferred embodiment of the invention is shown. This invention may, however, be embodied in many different forms and should not be construed as being limited to the embodiment set forth herein; rather, the embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

The present invention is now described in detail with reference to FIGS. 1 through 6. FIGS. 1 through 6 are sectional views illustrating a method of fabricating a complementary metal oxide semiconductor (CMOS) transistor.

In FIG. 1, a well 120 doped with an n-type material is formed in a semiconductor substrate 110 doped with a p-type material. A PMOS transistor is formed on the n-type well 120 in a region denoted by "B" in FIG. 1. An NMOS transistor is formed on the semiconductor substrate 110, where the n-type well 120 is not formed in a region denoted by "A" in FIG. 1. A gate insulating film 130A and a gate electrode 140A of an n-type MOS (NMOS) transistor are formed on the semiconductor substrate 110 in the region A. A gate insulating film 130B and a gate electrode 140B of a p-type MOS (PMOS) transistor are formed on the semiconductor substrate 110 in the region B, in which the n-type well 120 is formed. The gate electrodes 140A and 140B are preferably formed of polysilicon in a successive silicide process. A middle temperature oxide (MTO) film 150 and an insulating material layer 160 are sequentially formed on the semiconductor substrate 110, on the side walls of the gate electrodes 140A and 140B, and on top of the gate electrodes 140A and 140B. A polysilicon layer (not shown) is formed on an insulating material layer 160. Spacers 170A and 170B are formed on the side walls of the gate electrodes 140A and 140B, on which the insulating material layer 160 is formed. An etch back process is performed to form the spacers 170A and 170B. The insulating material layer 160 is formed of a material having a different etching selectivity from the etching selectivity of the material used to form the spacers 170A and 170B. The insulating material layer 160 is preferably formed of $Si_3N_4$. The spacers 170A and 170B are preferably formed of polysilicon.

Figure 2:
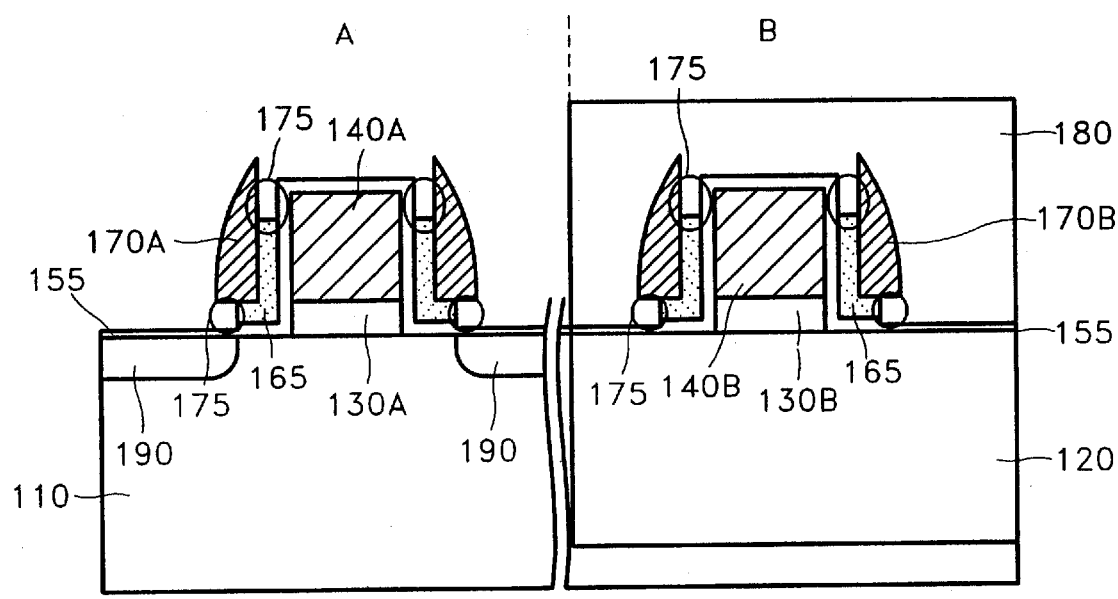

In FIG. 2, insulating films 165 are formed only at the edges formed by the semiconductor substrate 110 and the gate electrodes 140A and 140B by etching an insulating material layer 160 such that undercuts 175 are formed between the gate electrodes 140A and 140B and the respective spacers 170A and 170B and between the semiconductor substrate 110 and the spacers 170A and 170B. The insulating films 165 are "L" shaped since the insulating films 165 are formed along the gate electrodes 140A and 140B and the semiconductor substrate 110. The area in which silicide is formed increases in accordance with the area in which the undercuts 175 are formed during the process of forming silicide. Since a top portion of the upper surface of the MTO film is etched during the etching of the insulating material layer, the etched MTO film is denoted by 155. Next, region B is covered with a first photoresist pattern 180. First impurity regions 190 of an n-type material, which have first density, are formed in the semiconductor substrate 110 in the region A. The first impurity regions 190 are formed by ion implanting an n-type material having the first density into the semiconductor substrate 110 in the region A and performing annealing. At this time, ions of the first conductivity type material are implanted into the gate electrode 140A of the region A. Here, ions may not be implanted into the gate electrode 140A of the region A.

Figure 3:
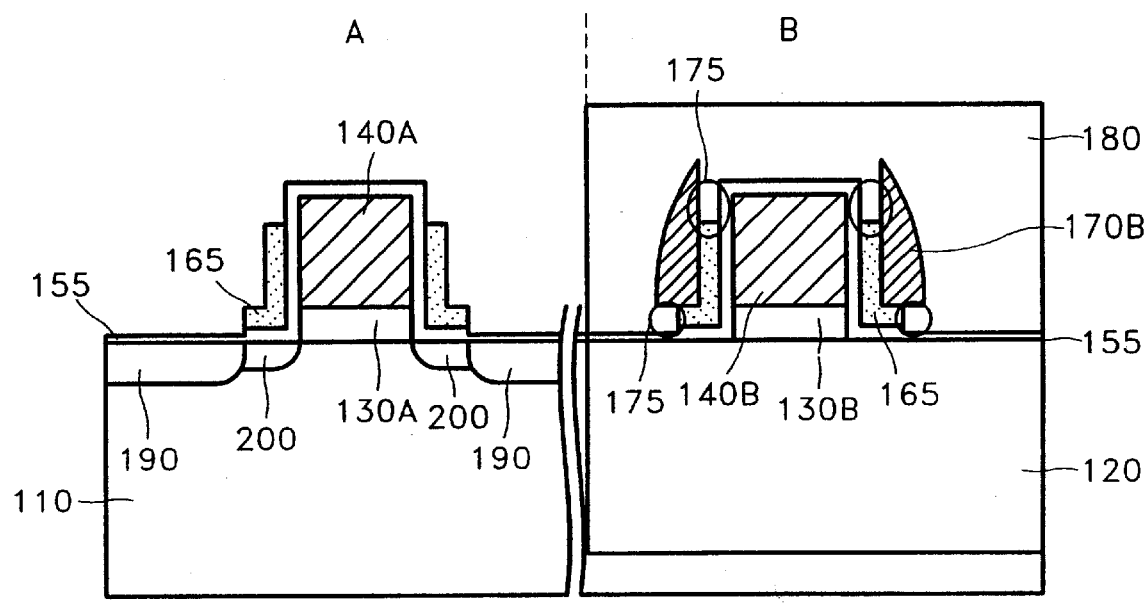

In FIG. 3, the spacers 170A in the region A are removed, and n-type material regions 200 of the first conductivity type, which have a second density that is lower than the first density, are formed in the semiconductor substrate 110 under the insulating films 165. The spacers 170A are removed using, for example, $NH_4OH$. The second impurity regions 200 are formed by implanting second impurity ions at a high energy so that the n-type material can pass through the insulating films 165, and then performing annealing.

Figure 4:
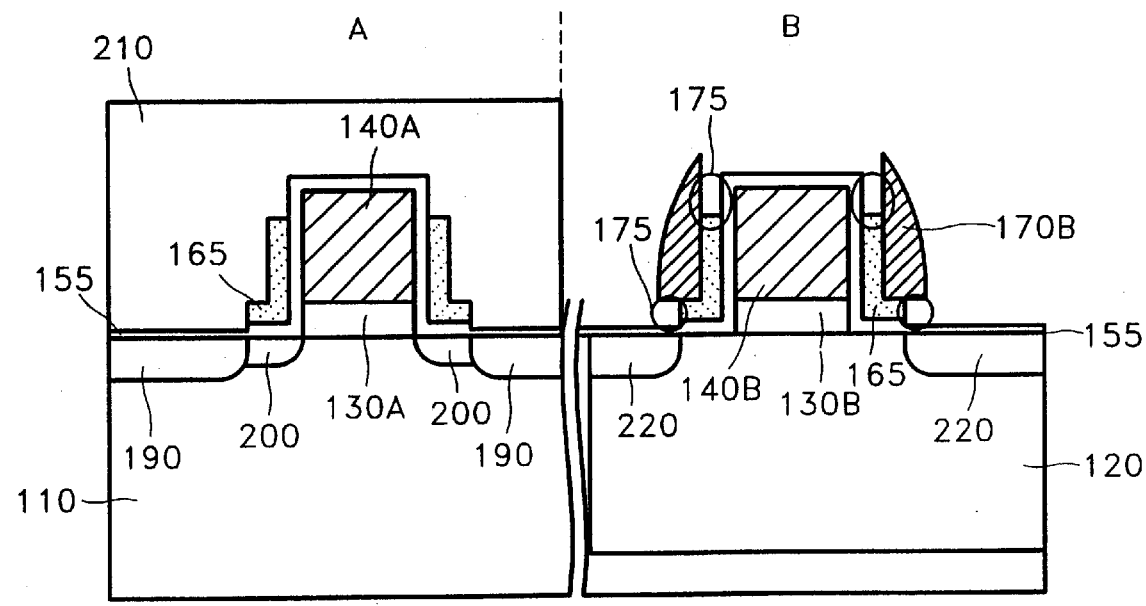

In FIG. 4, after removing the first photoresist pattern 180, the region A is covered with a second photoresist pattern 210, and third impurity regions 220 of the p-type, which have the third density, are formed in the semiconductor substrate 110 in the region B. The processes of forming the third impurity regions 220 are the same as the processes of forming the first impurity regions 190. Namely, a second conductive material having the third density is ion implanted into the semiconductor substrate 110 of the region B using the spacers 170B and the insulating films 165 as masks, and then the annealing is performed.

Figure 5:
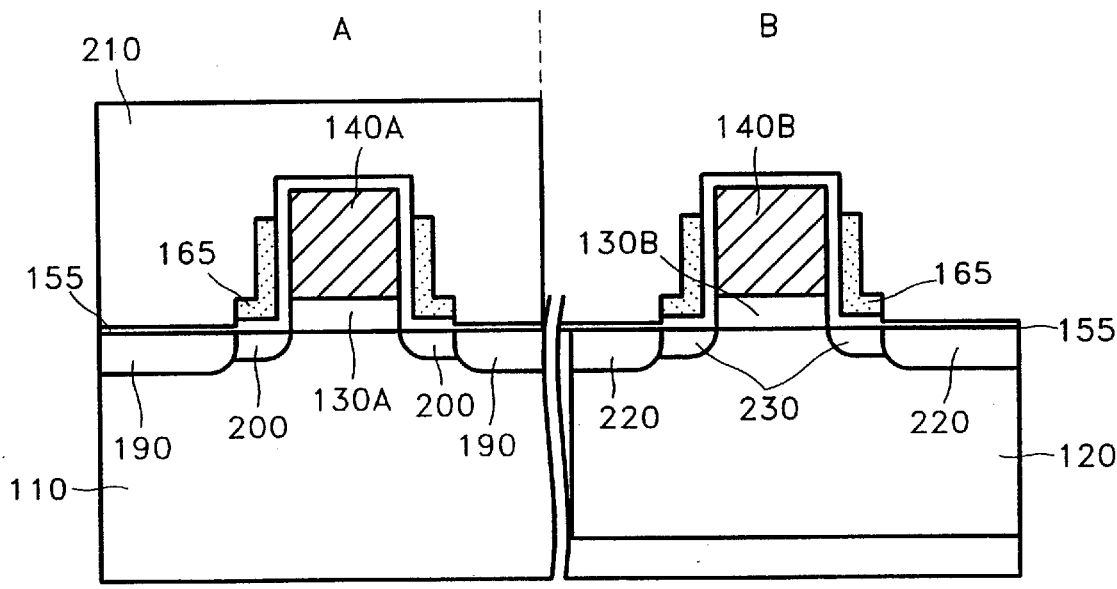

In FIG. 5, the spacers 170B of the region B are removed, and fourth impurity regions 230 of the p-type, which have the fourth density, are formed in the semiconductor substrate 110 under the insulating films 165. The spacers 170B are removed using $NH_4OH$. The fourth impurity regions 230 are formed by implanting p-type material at a high energy so that the p-type material can pass through the insulating films 165 into the semiconductor substrate 110 in the region B, and then performing the annealing.

As a result, the thermal step of the low density impurity regions 200 and 230 is performed only a single time since the first high density impurity region 190 and the third high density impurity region 220 are formed prior to forming the second low density impurity region 200 and the fourth low density impurity region 230. Thus, the thermal stress of the low density regions 200 and 230 is reduced. Also, the photoresist pattern-forming process is performed only two times in the present process, as compared to four times in the conventional CMOS transistor with the LDD structure, and thus is simplified.

Figure 6:
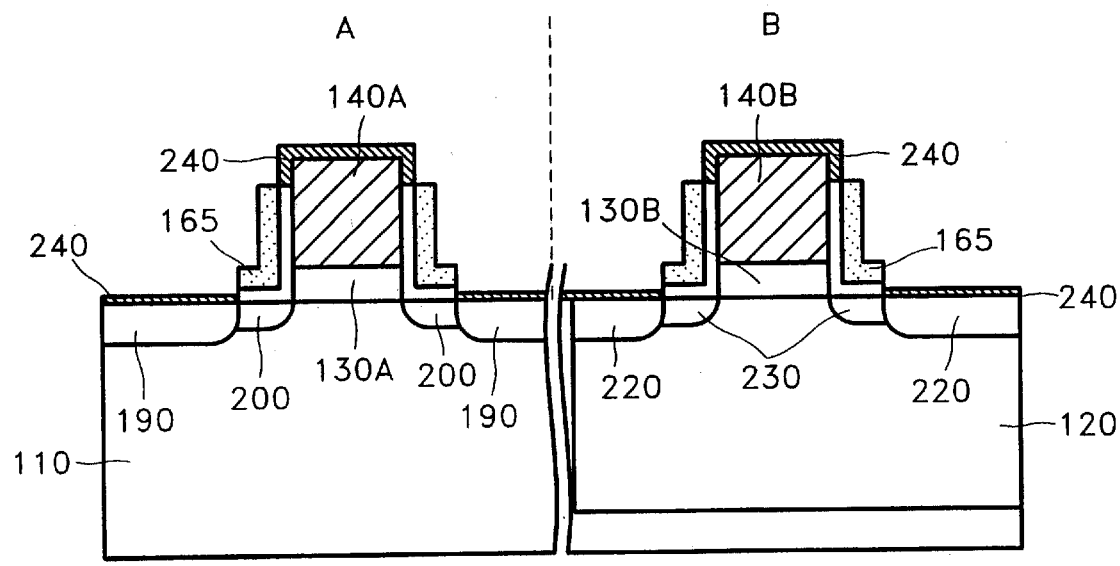

In FIG. 6, the etched MTO film 155 remaining on the semiconductor substrate 110 where the first impurity regions 190 are formed, on the semiconductor substrate 110 where the third impurity regions 220 are formed, on the gate electrodes 140A and 140B, and on the upper side walls of the gate electrodes 140A and 140B, on which the insulating films 165 are not formed, is removed (not shown). A metal film (not shown) reacts with the polysilicon film formed on the semiconductor substrate 110 where the first impurity regions 190 are formed, on the semiconductor substrate 110 where the third impurity regions 220 are formed, on the gate electrodes 140A and 140B, and on the upper side walls of the gate electrodes 140A and 140B, on which the insulating films 165 are not formed, by forming a high melting point-metal film (not shown) on the entire surface of the semiconductor substrate 110 and then performing the annealing. When the reaction is performed, silicide films 240 are formed on the semiconductor substrate 110 where the first impurity regions 190 are formed, on the semiconductor substrate 110 where the third impurity regions 220 are formed, on the gate electrodes 140A and 140B, and on the upper side walls of the gate electrodes 140A and 140B, on which the insulating films 165 are not formed.

As mentioned above, for the MOS transistor according to the present invention and the method of fabricating the same, it is possible to reduce the thermal stress of the low density source/drain region by forming the high density source/drain region before the low density source/drain region is formed and to increase the area, in which the silicide is formed, by forming the structure without the spacers. In addition, it is possible by this method to simplify the processes of fabricating the CMOS LDD MOS transistor by reducing the number of photoresist pattern-forming processes.

What is claimed is:

1. A method of fabricating a complementary metal oxide semiconductor (CMOS) transistor having p-type (PMOS) and n-type (NMOS) transistors comprising:
    providing a semiconductor substrate;
    forming gate electrodes on the semiconductor substrate in PMOS and NMOS regions of the substrate corresponding respectively to PMOS and NMOS transistors;
    forming a middle temperature oxide (MTO) layer on a top portion and side walls of the gate electrodes and on the semiconductor substrate in the PMOS and NMOS regions;
    forming an insulating layer on the MTO layer;
    forming spacers adjacent the insulating layer at both side walls of the gate electrodes;
    selectively removing the insulating layer such that portions of the insulating layer remain between the spacers and MTO layer; and
    in each of the PMOS and NMOS regions:
        forming first impurity regions having a first density on both sides of the spacers in the semiconductor substrate under the MTO layer;
        removing the spacers; and
        following removal of the spacers, forming second impurity regions having a second density that is lower than the first density on both sides of the gate electrodes in the semiconductor substrate.

2. The method of claim 1, wherein in the step of forming the first impurity regions, impurities are ion implanted into the semiconductor substrate through the MTO layer using the gate electrode and the spacers as masks.

3. The method of claim 1, wherein the spacers are formed of polysilicon.

4. The method of claim 1, wherein the spacers are removed using $NH_4OH$.

5. The method of claim 1, wherein the step of selectively removing portions of the insulating layer further comprises removing portions of the insulating layer such that undercuts are formed in the insulating layer between the side walls of the gate electrodes and the spacers and between a bottom portion of the spacers and the semiconductor substrate.

6. The method of claim 5, wherein the step of forming the insulating layer further comprises the steps of:
    forming spacers having a different etching selectivity from the etching selectivity of the insulating layer adjacent the insulating layer at the side walls of the gate electrodes, on which the insulating layer is formed; and
    etching the insulating material layer such that undercuts are formed in the insulating layer between the side walls of the gate electrodes and the spacers and between a bottom portion of the spacers and the semiconductor substrate.

7. The method of claim 5, wherein the remaining portions of the insulating layer are formed to have an "L" shaped cross-section.

8. The method of claim 5, wherein the insulating layer is formed of $Si_3N_4$.

9. The method of claim 5, further comprising:
following formation of the first and second impurity regions, removing the MTO layer at the top portion the gate electrodes, an upper portion of the side walls of the gate electrodes and on the semiconductor substrate using the remaining insulating layer portions as a mask, and
forming a metal silicide film on the semiconductor substrate where the first impurity regions are formed, on the gate electrodes, and on the upper portion of the side walls of the gate electrodes.

10. The method of claim 5, wherein the spacers are formed of polysilicon.

11. The method of claim 5, wherein the spacers are removed using $NH_4OH$.

12. A method of fabricating a MOS transistor comprising the steps of:
forming a first region and a second region on a semiconductor substrate;
forming a first gate electrode and a second gate electrode on the first region and the second region of the semiconductor substrate, respectively;
forming a middle temperature oxide (MTO) layer on the first and second gate electrodes and on the semiconductor substrate in the first and second regions;
forming an insulating layer on the MTO layer;
forming spacers adjacent the insulating layer at both side walls of the first gate electrode and the second gate electrode;
selectively removing the insulating layer such that portions of the insulating layer remain between the spacers and the MTO layer;
covering the entire surface of the semiconductor substrate in the second region with a first mask and forming first impurity regions doped with a first conductivity type material having a first density in the semiconductor substrate in the first region using the spacers and the first gate electrode formed in the first region as masks;
removing the spacers of the first region;
following removal of the spacers of the first region, forming second impurity regions doped with the first conductivity type material having a second density that is lower than the first density in the semiconductor substrate on both sides of the first gate electrode exposed by removing the spacers of the first region;
covering the entire surface of the semiconductor substrate of the first region with a second mask and forming third impurity regions doped with a second conductivity type material having a third density in the semiconductor substrate in the second region using the spacers and the second gate electrode formed in the second region as masks after a step of removing the first mask;
removing the spacers of the second region; and
following removal of the spacers of the second region, forming fourth impurity regions doped with the second conductivity type material having a fourth density that is lower than the third density in the semiconductor substrate on both sides of the second gate electrode exposed by removing the spacers of the second region.

13. The method of claim 12, wherein in the step of forming the first impurity regions, the first conductivity type material is ion implanted into the semiconductor substrate of the first region using the first gate electrode and the spacers, which are formed in the first region, as masks.

14. The method of claim 12, wherein in the step of forming the third impurity regions, the second conductivity type material is ion implanted into the semiconductor substrate of the second region using the second gate electrode and the spacers, which are formed in the second region, as masks.

15. The method of claim 12, wherein the spacers are formed of polysilicon.

16. The method of claim 12, wherein the spacers are removed by wet etching.

17. The method of claim 16, wherein the spacers are removed using $NH_4OH$.

18. The method of claim 12, wherein the step of selectively removing the insulating layer further comprises removing portions of the insulating layer so that undercuts are formed in the insulating layer between side walls of the first and second gate electrodes and the spacers and between a bottom portion of the spacers and the semiconductor substrate.

19. The method of claim 18, further comprising:
following formation of the fourth impurity regions, removing the second mask;
removing the MTO layer at a top portion the gate electrodes, an upper portion of the side walls of the gate electrodes and on the semiconductor substrate using the remaining insulating layer portions as a mask, and
forming a metal suicide film on the semiconductor substrate where the first impurity regions are formed, on the semiconductor substrate where the third impurity regions are formed, on the first and second gate electrodes, and on the upper portion of the side walls of the gate electrodes.

20. The method of claim 18, wherein the step of forming the insulating films comprises the steps of:
forming spacers having different etch selectivity from the etching selectivity of the insulating layer adjacent the insulating layer at the side walls of the first and second gate electrodes, on which the insulating layer is formed; and
etching the insulating material layer so that the undercuts are formed in the insulating layer between the side walls of the first and second gate electrodes and the spacers and between a bottom portion of the spacers and the semiconductor substrate.

21. The method of claim 18, wherein the remaining portions of the insulating layer are formed to have an "L" shaped cross-section.

22. The method of claim 18, wherein the insulating films are formed of $Si_3N_4$.

23. The method of claim 18, wherein the spacers are formed of polysilicon.

24. The method of claim 18, wherein the spacers are removed by wet etching.

25. The method of claim 24, wherein the spacers are removed using $NH_4OH$.

* * * * *

UNITED STATES PATENT AND TRADEMARK OFFICE
CERTIFICATE OF CORRECTION

PATENT NO.   : 6,541,328 B2  Page 1 of 1
DATED        : April 1, 2003
INVENTOR(S)  : Sung-man Whang et al.

It is certified that error appears in the above-identified patent and that said Letters Patent is hereby corrected as shown below:

<u>Column 8,</u>
Line 35, delete "suicide" and insert -- silicide --.

Signed and Sealed this

First Day of July, 2003

JAMES E. ROGAN
*Director of the United States Patent and Trademark Office*